(12) United States Patent
Kalra et al.

(10) Patent No.: US 8,436,447 B2
(45) Date of Patent: May 7, 2013

(54) MEMORY CELL THAT INCLUDES A CARBON-BASED MEMORY ELEMENT AND METHODS OF FORMING THE SAME

(75) Inventors: Pankaj Kalra, Mountain View, CA (US); Raghuveer S. Makala, Sunnyvale, CA (US)

(73) Assignee: SanDisk 3D LLC, Milpitas, CA (US)

( * ) Notice: Subject to any disclaimer, the term of this patent is extended or adjusted under 35 U.S.C. 154(b) by 162 days.

(21) Appl. No.: 12/765,955

(22) Filed: Apr. 23, 2010

(65) Prior Publication Data
US 2011/0260290 A1 Oct. 27, 2011

(51) Int. Cl.
H01L 21/02 (2006.01)

(52) U.S. Cl.
USPC ............... 257/538; 257/5; 257/528; 438/458; 438/477

(58) Field of Classification Search .................. 257/538, 257/5, 528, E51.04, E21.21, E21, E21.47, 257/E21.09, E21.41; 438/458, 477
See application file for complete search history.

(56) References Cited

U.S. PATENT DOCUMENTS

| | | | |
|---|---|---|---|
| 5,915,167 A | 6/1999 | Leedy | |
| 6,952,030 B2 | 10/2005 | Herner | |
| 7,176,064 B2 | 2/2007 | Herner | |
| 7,385,266 B2 * | 6/2008 | Segal et al. | 257/414 |
| 7,405,465 B2 | 7/2008 | Herner | |
| 7,851,887 B2 * | 12/2010 | Son | 257/536 |
| 7,935,517 B2 * | 5/2011 | Cai et al. | 435/285.3 |
| 8,065,634 B1 * | 11/2011 | Patil et al. | 716/30 |
| 2003/0165418 A1 * | 9/2003 | Ajayan et al. | 423/447.2 |
| 2004/0005258 A1 * | 1/2004 | Fonash et al. | 422/271 |
| 2004/0087162 A1 * | 5/2004 | Vogeli | 438/694 |
| 2005/0276093 A1 * | 12/2005 | Graham et al. | 365/149 |
| 2005/0276743 A1 * | 12/2005 | Lacombe et al. | 423/447.3 |
| 2006/0086958 A1 | 4/2006 | Eimori | |
| 2006/0250836 A1 * | 11/2006 | Herner et al. | 365/148 |
| 2007/0190722 A1 * | 8/2007 | Herner | 438/257 |

(Continued)

FOREIGN PATENT DOCUMENTS

| | | |
|---|---|---|
| FR | 2926669 | 7/2009 |
| WO | WO 2010/009364 | 1/2010 |
| WO | WO 2010/017428 | 2/2010 |

OTHER PUBLICATIONS

International Search Report and Written Opinion of related International Application No. PCT/US2011/032850 mailed Aug. 24, 2011.

(Continued)

Primary Examiner — Fernando L Toledo
Assistant Examiner — Mohammed Shamsuzzaman
(74) Attorney, Agent, or Firm — Dugan & Dugan, PC

(57) ABSTRACT

In a first aspect, a memory cell is provided, the memory cell including: (a) a first conducting layer formed above a substrate; (b) a second conducting layer formed above the first conducting layer; (c) a structure formed between the first and second conducting layers, wherein the structure includes a sidewall that defines an opening extending between the first and second conducting layers, and wherein the structure is comprised of a material that facilitates selective, directional growth of carbon nano-tubes; and (d) a carbon-based switching layer that includes carbon nano-tubes formed on the sidewall of the structure. Numerous other aspects are provided.

22 Claims, 16 Drawing Sheets

U.S. PATENT DOCUMENTS

| | | | |
|---|---|---|---|
| 2008/0142866 A1* | 6/2008 | Choi et al. | 257/309 |
| 2008/0157257 A1* | 7/2008 | Bertin et al. | 257/476 |
| 2009/0001345 A1* | 1/2009 | Schricker et al. | 257/4 |
| 2009/0014767 A1* | 1/2009 | Furukawa et al. | 257/301 |
| 2009/0162927 A1* | 6/2009 | Naaman et al. | 435/287.1 |
| 2009/0168491 A1 | 7/2009 | Schricker | |
| 2009/0271982 A1* | 11/2009 | Lee et al. | 29/846 |
| 2009/0289322 A1* | 11/2009 | Moon et al. | 257/485 |
| 2010/0005553 A1* | 1/2010 | Jin et al. | 850/58 |
| 2010/0081268 A1* | 4/2010 | Schricker et al. | 438/600 |
| 2010/0108976 A1* | 5/2010 | Jayasekara et al. | 257/4 |
| 2011/0133151 A1* | 6/2011 | Li et al. | 257/4 |

OTHER PUBLICATIONS

Schricker, U.S. Appl. No. 12/415,011, filed Mar. 31, 2009.
A. Cao et al., "Direction-Selective and Length-Tunable In-Plane Growth of Carbon Nanotubes", Jul. 4, 2003, Advanced Materials 15, No. 13, pp. 1105-1109.
D. Kondo et al., "Selective Growth of Vertically Aligned Double- and Single-Walled Carbon Nanotubes on a Substrate at 590° C.", 2008, IOP Publishing Ltd, Nanotechnology 19, pp. 1-6.
R. Vajtai et al., "Building and Testing Organized Architectures of Carbon Nanotubes", Dec. 2003, IEEE Transactions on Nanotechnology, vol. 2, No. 4, pp. 355-361.

* cited by examiner

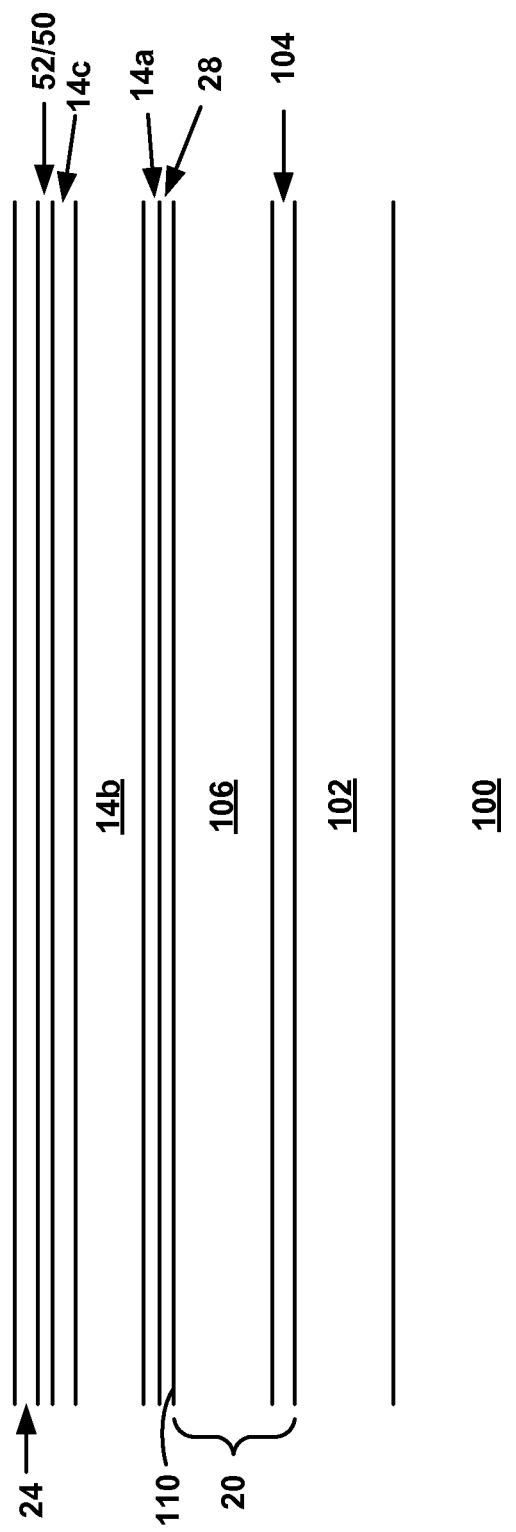

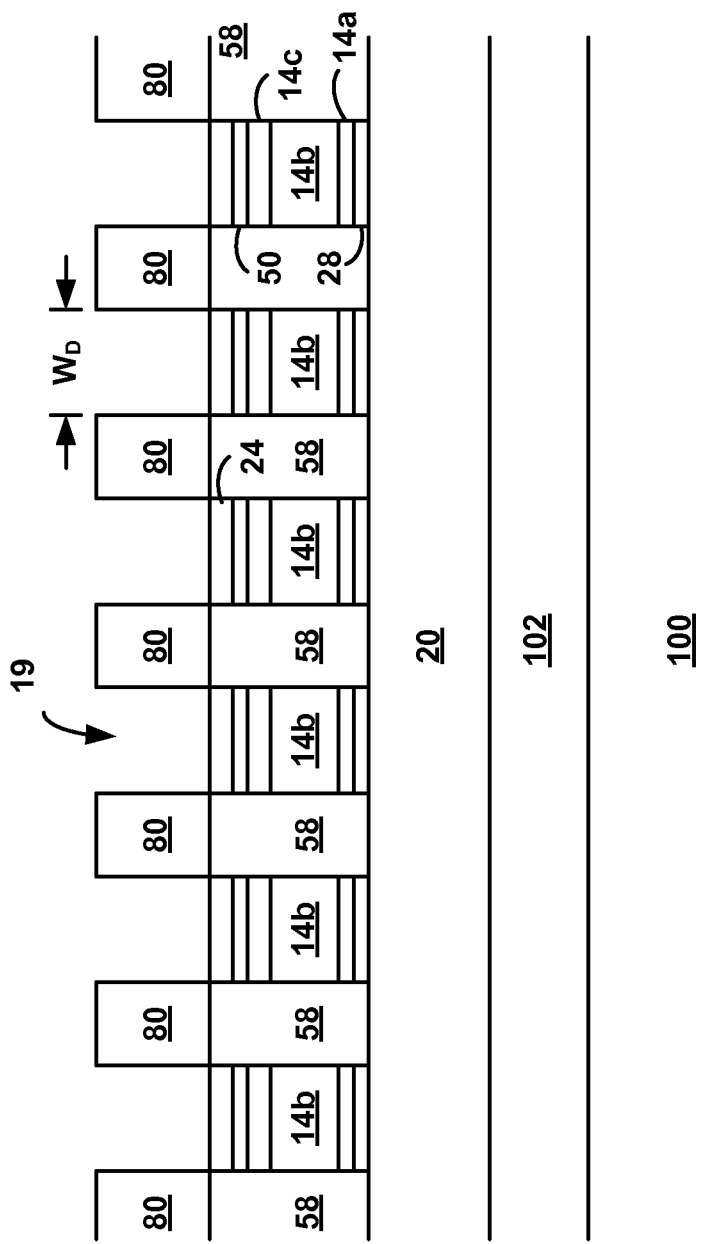

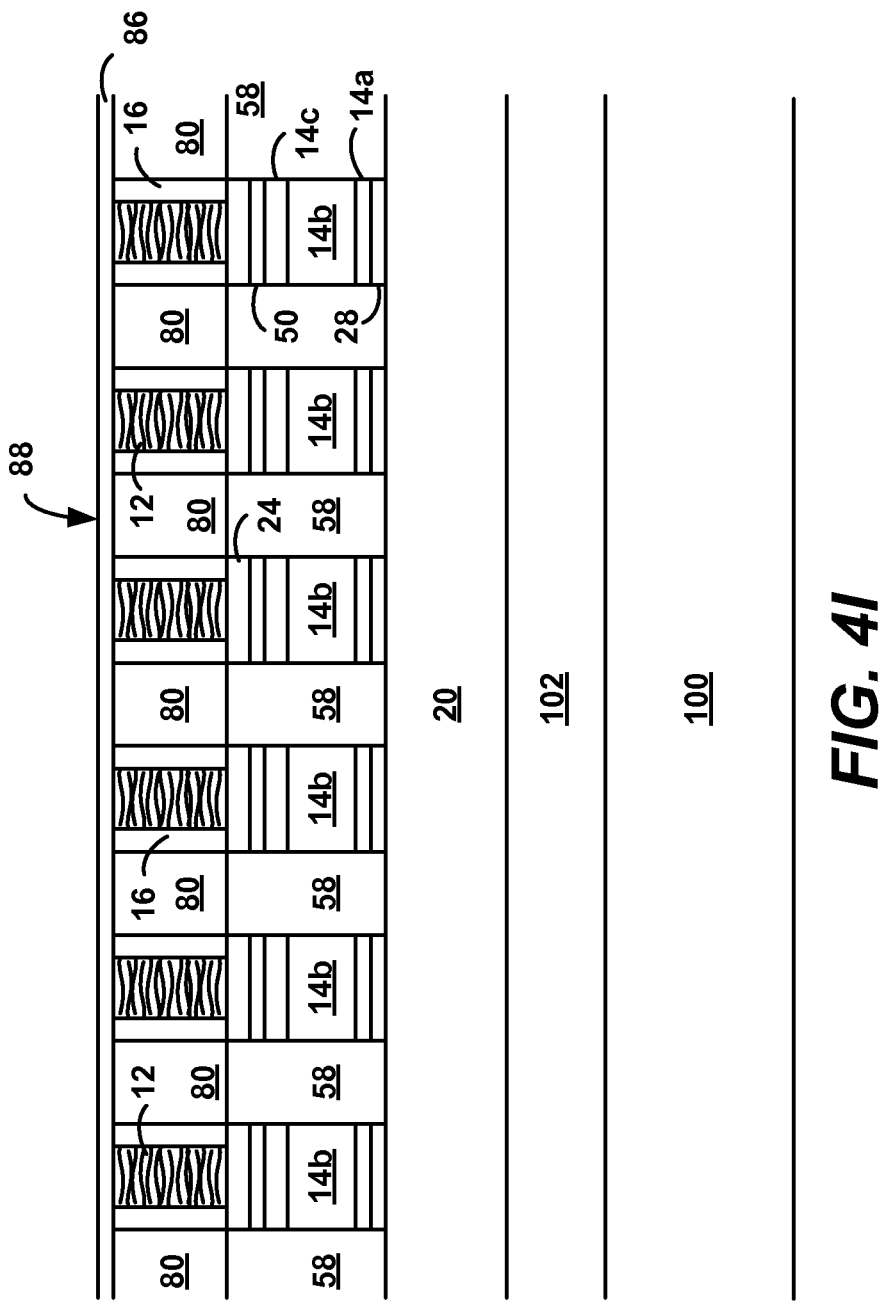

US 8,436,447 B2

MEMORY CELL THAT INCLUDES A CARBON-BASED MEMORY ELEMENT AND METHODS OF FORMING THE SAME

TECHNICAL FIELD

This invention relates to non-volatile memories, and more particularly to a memory cell that includes a carbon-based memory element, and methods of forming the same.

BACKGROUND

Non-volatile memories formed from reversible resistance-switching elements are known. For example, U.S. patent application Ser. No. 11/968,154, filed Dec. 31, 2007, titled "Memory Cell That Employs A Selectively Fabricated Carbon Nano-Tube Reversible Resistance Switching Element And Methods Of Forming The Same" (the "'154 application"), which is hereby incorporated by reference herein in its entirety for all purposes, describes a rewriteable non-volatile memory cell that includes a diode coupled in series with a carbon-based reversible resistivity-switching material.

However, fabricating memory devices from carbon-based materials is technically challenging, and improved methods of forming memory devices that employ carbon-based materials are desirable.

SUMMARY

In a first aspect of the invention, a memory cell is provided, the memory cell including: (a) a first conducting layer formed above a substrate; (b) a second conducting layer formed above the first conducting layer; (c) a structure formed between the first and second conducting layers, wherein the structure includes a sidewall that defines an opening extending between the first and second conducting layers, and wherein the structure is comprised of a material that facilitates selective, directional growth of carbon nano-tubes; and (d) a carbon-based switching layer that includes carbon nano-tubes formed on the sidewall of the structure.

In a second aspect of the invention, a memory cell is provided, the memory cell including: (a) a first conducting layer formed above a substrate; (b) a second conducting layer formed above the first conducting layer; (c) an oxide structure formed between the first and second conducting layers, wherein the oxide structure includes a sidewall that defines an opening extending between the first and second conducting layers; and (d) a carbon-based switching layer that includes carbon nano-tubes formed on the sidewall of the structure.

In a third aspect of the invention, a method of forming a reversible resistance-switching metal-carbon-metal ("MCM") structure is provided, the method including: (a) forming first and second conducting layers above a substrate; and (b) forming a carbon-based switching layer between the first and second conducting layers, wherein the carbon-based switching layer includes carbon nanotubes that have a long axis substantially parallel to the substrate.

In a fourth aspect of the invention, a method of forming a memory cell is provided, the method including: (a) forming a first conducting layer; (b) forming a second conducting layer above the first conductor; (c) forming an oxide structure between the first and second conducting layers, wherein the oxide structure includes a sidewall that defines an opening extending between the first and second conducting layers; (d) forming a carbon-based switching layer including carbon nano-tubes on the sidewall; and (e) forming a steering element coupled to the carbon-based switching layer. Numerous other aspects are provided.

BRIEF DESCRIPTION OF THE DRAWINGS

Features of the present invention can be more clearly understood from the following detailed description considered in conjunction with the following drawings, in which the same reference numerals denote the same elements throughout, and in which:

FIGS. 4A-4L illustrate cross-sectional views of a portion of a substrate during an exemplary fabrication of a single memory level in accordance with this invention.

DETAILED DESCRIPTION

Figure 1:
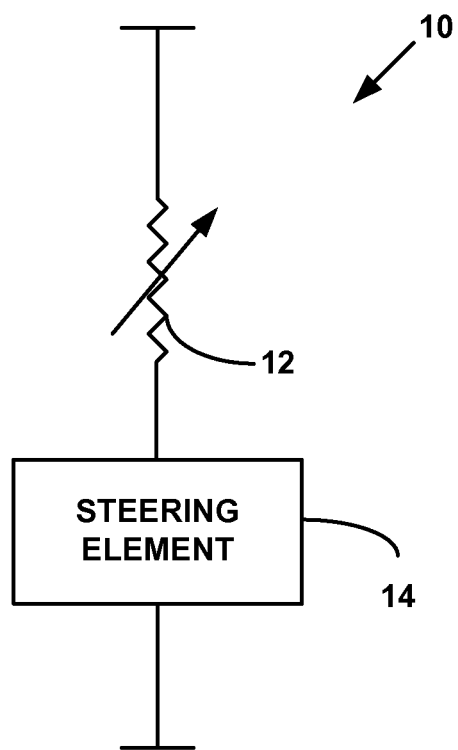
FIG. 1 is a diagram of an exemplary memory cell in accordance with this invention.

Carbon films such as graphene, graphite, carbon nano-tubes (collectively referred to herein as "graphitic carbon"), amorphous carbon ("aC") containing nanocrystalline graphene, amorphous diamond-like carbon ("DLC"), silicon carbide, boron carbide and other similar carbon-based materials may exhibit resistivity-switching behavior that may make such materials suitable for use in microelectronic non-volatile memories.

Indeed, carbon nano-tube ("CNT") materials have demonstrated memory switching properties on lab-scale devices with a 100× separation between ON and OFF states and mid-to-high range resistance changes. Such a separation between ON and OFF states renders carbon-based materials viable candidates for memory cells in which the CNT material is coupled in series with vertical diodes, thin film transistors or other steering elements.

For example, an MCM stack formed from a CNT material sandwiched between two metal or otherwise conducting layers may serve as a resistance-switching element for a memory cell. In particular, a CNT MCM stack may be integrated in series with a diode or transistor to create a read-writable memory device as described, for example, in the '154 application.

Fabricating memory devices from carbon-based materials, however, is technically challenging. For example, homogeneous CNT materials are known to be porous, so a conventionally-formed CNT MCM stack is prone to short-circuiting. In particular, to form a CNT memory circuit using conventional semiconductor processes, physical vapor deposition ("PVD") processing steps are typically used to form the top and bottom electrodes of the memory cell. The high energy levels of PVD-based top electrode metal deposition, however, may cause metal to infiltrate, and possibly penetrate, one or more pores in the CNT material, possibly causing a short with the bottom electrode.

One approach to mitigating the problem of penetration is to deposit a layer of CNT material of sufficient thickness to reduce or eliminate the probability that a short circuit may occur. However, forming a CNT layer of sufficient thickness can be challenging. For example, many commonly used techniques for forming CNT material, such as spin- and spray-coating techniques, produce a thin CNT layer during a single application, and therefore require multiple applications to form a thicker layer. However, repeated applications of such techniques can be unacceptably time-consuming.

In addition, spin- and spray-coated CNT material often includes large voids, and has a rough surface topography, with pronounced thickness variations, such as numerous peaks and valleys. These thickness variations make CNT materials difficult to etch without excessive etching of the underlying substrate, increasing fabrication costs and complexity associated with their use in integrated circuits. In addition, spin- and spray-coated CNT material often includes unwanted particles, which reduces device yield. Moreover, because CNT films may be opaque as well as rough, blanket CNT films may cause overlay/alignment difficulties between printed layers.

Another challenge associated with use of CNT materials in memory devices is the susceptibility of CNT materials to being damaged during conventional fabrication processes. For example, exposed carbon-based materials sometimes suffer physical damage from the processes and chemicals commonly used to etch features in memory cells. Exposed carbon-based materials may also suffer damage from certain deposition processes, such as PVD, that are used to form additional layers in a memory cell. Such films also may suffer from adhesion/peeling issues. This particular issue limits the choice of metals that can be used as electrodes.

In an exemplary embodiment of this invention, the challenges discussed above are mitigated or eliminated by forming a memory cell that includes a structure fabricated from a material that facilitates selective, directional growth of CNTs by a chemical vapor deposition process. In some embodiments, the structure is formed above a substrate from an oxide material using a spacer etch to create a reverse spacer of oxide material. CNT growth on oxide is highly directional. In exemplary embodiments of this invention, CNTs grown on the sidewalls of the oxide spacer in a direction substantially parallel to the substrate. That is, CNTs have a long axis that is substantially parallel to the substrate.

These and other advantages of the invention are described below with reference to FIGS. 1-4L.

Exemplary Inventive Memory Cell

FIG. 1 illustrates an exemplary memory cell 10 in accordance with this invention. Memory cell 10 includes a reversible resistance-switching element 12 coupled to a steering element 14. Reversible resistance-switching element 12 includes a reversible resistivity-switching material (not separately shown) having a resistivity that may be reversibly switched between two or more states.

For example, the reversible resistivity-switching material of element 12 may be in an initial, low-resistivity state upon fabrication. Upon application of a first voltage and/or current, the material is switchable to a high-resistivity state. Application of a second voltage and/or current may return the reversible resistivity-switching material to a low-resistivity state. Alternatively, reversible resistance-switching element 12 may be in an initial, high-resistance state upon fabrication that is reversibly switchable to a low-resistance state upon application of the appropriate voltage(s) and/or current(s). When used in a memory cell, one resistance state may represent a binary "0," whereas another resistance state may represent a binary "1," although more than two data/resistance states may be used.

Numerous reversible resistivity-switching materials and operation of memory cells employing reversible resistance-switching elements are described, for example, in U.S. patent application Ser. No. 11/125,939, filed May 9, 2005 and titled "Rewriteable Memory Cell Comprising A Diode And A Resistance Switching Material" (the "'939 application"), which is hereby incorporated by reference herein in its entirety for all purposes.

Steering element 14 may include a thin film transistor, a diode, a metal-insulator-metal tunneling current device, or another similar steering element that exhibits non-ohmic conduction by selectively limiting the voltage across and/or the current flow through reversible resistance-switching element 12. In this manner, memory cell 10 may be used as part of a two or three dimensional memory array and data may be written to and/or read from memory cell 10 without affecting the state of other memory cells in the array.

Exemplary embodiments of memory cell 10, reversible resistance-switching element 12 and steering element 14 are described below with reference to FIGS. 2A-2D and FIGS. 3A and 3B.

Exemplary Embodiments of Memory Cells and Memory Arrays

Figure 2A:
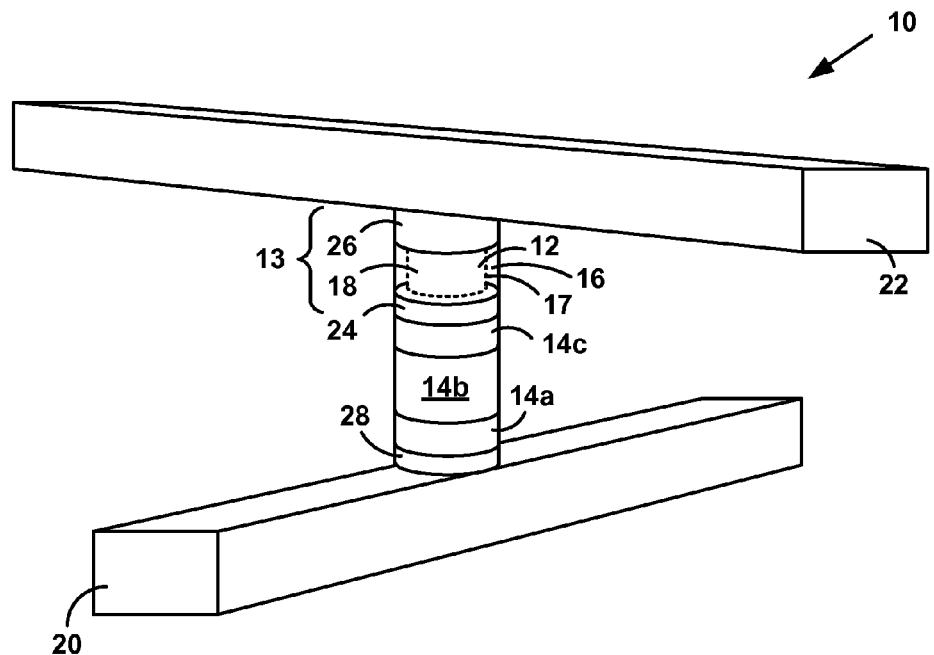
FIG. 2A is a simplified perspective view of an exemplary memory cell in accordance with this invention.

FIG. 2A is a simplified perspective view of an exemplary embodiment of a memory cell 10 in accordance with this invention. Memory cell 10 includes a carbon-based reversible resistivity-switching material 12 ("C-based switching material 12") coupled in series with a steering element 14 between a first conductor 20 and a second conductor 22. In some embodiments, C-based switching material 12 may be positioned below steering element 14. In some embodiments, steering element 14 may be omitted, and memory cell 10 may be used with a remotely located steering element.

In some embodiments, a barrier layer 24 may be formed between C-based switching material 12 and steering element 14, a barrier layer 26 may be formed between C-based switching material 12 and second conductor 22, and a barrier layer 28 may be formed between steering element 14 and first conductor 20. Barrier layers 24, 26 and 28 may include titanium, titanium nitride, tantalum, tantalum nitride, tungsten, tungsten nitride, molybdenum, or other similar barrier layer material. In some embodiments, barrier layer 28 may be formed as part of lower conductor 20, and barrier layer 26 may be formed as part of upper conductor 22. Barrier layer 24, C-based switching material 12, and barrier layer 26 form an MCM device 13, with barrier layers 24 and 26 forming the bottom and top electrodes, respectively, of MCM device 13.

Steering element 14 may include a thin film transistor, a diode, a metal-insulator-metal tunneling current device, or another similar steering element that exhibits non-ohmic conduction by selectively limiting the voltage across and/or the current flow through C-based switching material 12. In the example of FIG. 2A, steering element 14 is a diode. Accordingly, steering element 14 is sometimes referred to herein as "diode 14."

Diode 14 may include any suitable diode such as a vertical polycrystalline p-n or p-i-n diode, whether upward pointing with an n-region above a p-region of the diode or downward pointing with a p-region above an n-region of the diode. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above the intrinsic region 14b. It will be understood that the locations of the n+ and p+ regions may be reversed. Exemplary embodiments of diode 14 are described below with reference to FIGS. 3A and 3B.

In exemplary embodiments of this invention, memory cell 10 includes a structure 16 disposed between first conductor 20 and second conductor 22. As described in more detail below, structure 16 is fabricated from a material that facilitates selective, directional growth of CNTs by a chemical vapor deposition ("CVD") process. In some embodiments, structure 16 is formed from an oxide material using a spacer etch to create a reverse spacer of oxide material. For simplicity, the remaining discussion will describe oxide structures 16.

Oxide structure 16 includes a sidewall 17 that defines an opening 18 extending between barrier layer 24 and barrier layer 26. C-based switching material 12 may include CNT material ("CNT layer 12") selectively grown on sidewall 17 inside opening 18 of oxide structure 16. CNT layer 12 may include single wall tubes, double wall tubes, multi-wall tubes, combinations of the same or any other CNT form.

In exemplary embodiments of this invention, and as described in more detail below, CNT layer 12 is selectively formed on sidewall 17 of oxide structure 16 by a CVD process. In exemplary embodiments of this invention, CNT layer 12 includes carbon nano-tubes that have a long axis that is substantially parallel to the substrate.

In some embodiments, CNT layer 12 may include CNT material and filler material such as amorphous carbon, other carbon materials or dielectric filler material in any suitable ratio. In some embodiments, for instance, CNT material may be mixed with dielectric filler material, such as silicon nitride and silicon oxide nanoparticles (e.g., up to about 5% silicon nitride nanoparticles).

Examples of carbon-based films formed from mixtures of CNT material and various dielectric filler materials, and properties thereof, are described in U.S. patent application Ser. No. 12/415,011, filed Mar. 31, 2009, titled "Carbon-Based Films, And Methods Of Forming The Same, Having Dielectric Filler Material And Exhibiting Reduced Thermal Resistance," which is hereby incorporated by reference herein in its entirety for all purposes.

The nature of CNT material may be characterized by its ratio of forms of carbon-carbon bonding. Carbon typically bonds to carbon to form either an $sp^2$-bond (a trigonal double C=C bond) or an $sp^3$-bond (a tetrahedral single C—C bond). In each case, a ratio of $sp^2$-bonds to $sp^3$-bonds can be determined via Raman spectroscopy by evaluating the D and G bands. In some embodiments, the range of materials may include those having a ratio such as $M_y N_z$ where M is the $sp^3$ material and N is the $sp^2$ material and y and z are any fractional value from zero to 1 as long as y+z=1.

In some embodiments, a resistivity of C-based switching material 12 may be at least $1 \times 10^{-2}$ ohm-cm when C-based switching material 12 is in an ON-state, whereas a resistivity of C-based switching material 12 may be at least $1 \times 10^3$ ohm-cm when C-based switching material 12 is in an OFF-state. Other resistivity values may be used. Indeed, persons of ordinary skill in the art will understand that resistivity of CNT materials may depend on CNT type, tube length, and tube diameter.

First conductor 20 and/or second conductor 22 may include any suitable conductive material such as tungsten, any appropriate metal, heavily doped semiconductor material, a conductive silicide, a conductive silicide-germanide, a conductive germanide, or the like. In the embodiment of FIG. 2A, first and second conductors 20 and 22, respectively, are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with first conductor 20 and/or second conductor 22 to improve device performance and/or aid in device fabrication.

Figure 2B:
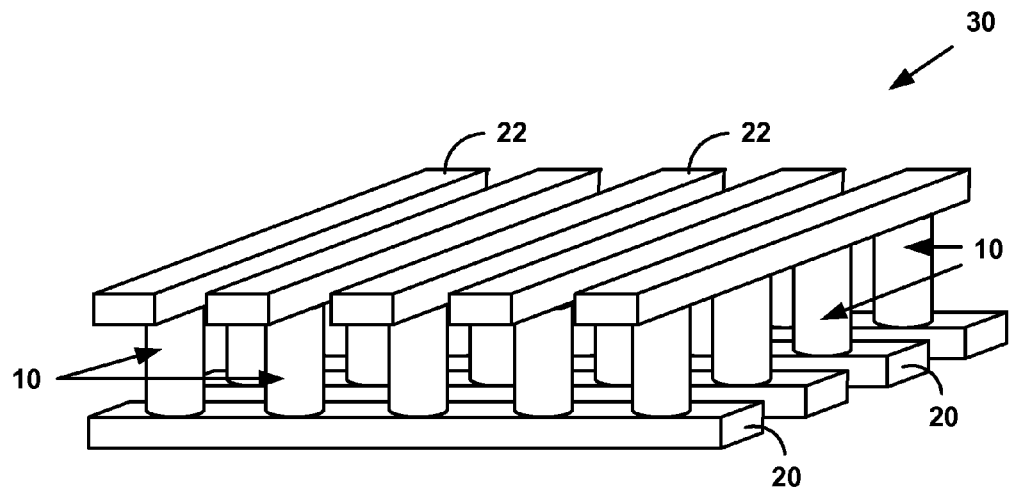
FIG. 2B is a simplified perspective view of a portion of a first exemplary memory level formed from a plurality of the memory cells of FIG. 2A.

FIG. 2B is a simplified perspective view of a portion of a first memory level 30 formed from a plurality of memory cells 10, such as memory cells 10 of FIG. 2A. For simplicity, CNT layer 12, diode 14, oxide structure 16, and barrier layers 24, 26 and 28 are not separately shown. Memory level 30 is a "cross-point" array including a plurality of bit lines (second conductors 22) and word lines (first conductors 20) to which multiple memory cells are coupled (as shown). Other memory array configurations may be used, as may multiple levels of memory.

Figure 2C:
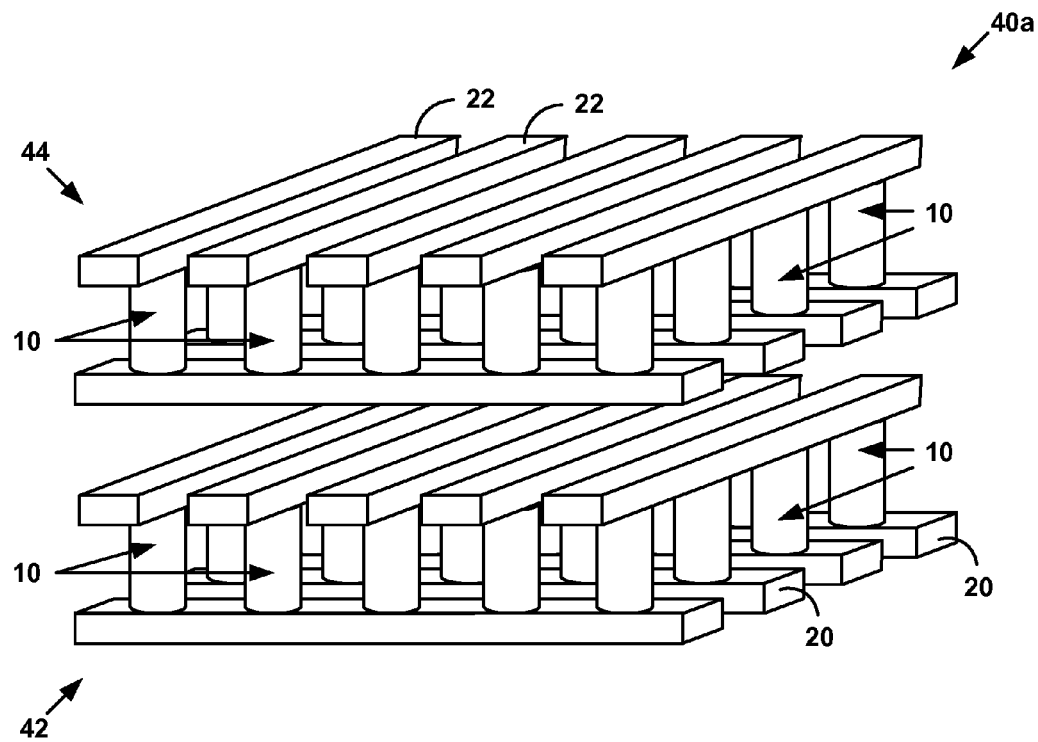
FIG. 2C is a simplified perspective view of a portion of a first exemplary three-dimensional memory array in accordance with this invention.

For example, FIG. 2C is a simplified perspective view of a portion of a monolithic three dimensional memory array 40a that includes a first memory level 42 positioned below a second memory level 44. Memory levels 42 and 44 each include a plurality of memory cells 10 in a cross-point array. Persons of ordinary skill in the art will understand that additional layers (e.g., an interlevel dielectric) may be present between first and second memory levels 42 and 44, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diode fabrication.

Figure 2D:
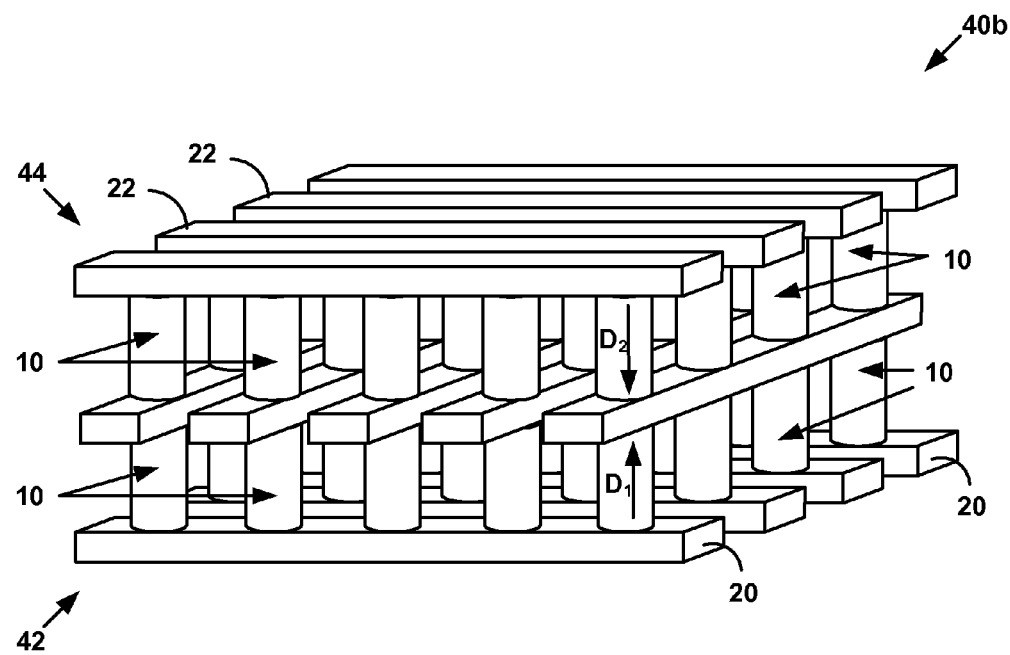
FIG. 2D is a simplified perspective view of a portion of a second exemplary three-dimensional memory array in accordance with this invention.

In some embodiments, the memory levels may be formed as described in U.S. Pat. No. 6,952,030, titled "High-Density Three-Dimensional Memory Cell," which is hereby incorporated by reference herein in its entirety for all purposes. For instance, the second conductors of a first memory level may be used as the first conductors of a second memory level that is positioned above the first memory level as shown in FIG. 2D. In such embodiments, the diodes on adjacent memory levels preferably point in opposite directions as described in U.S. patent application Ser. No. 11/692,151, filed Mar. 27, 2007 and titled "Large Array Of Upward Pointing P-I-N Diodes Having Large And Uniform Current" (the "'151 application"), which is hereby incorporated by reference herein in its entirety for all purposes.

For example, as shown in FIG. 2D, the diodes of first memory level 42 may be upward pointing diodes as indicated by arrow D1 (e.g., with p regions at the bottom of the diodes), whereas the diodes of the second memory level 44 may be downward pointing diodes as indicated by arrow D2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

As discussed above, spin- and spray-coated CNT films are known to be porous, and a conventionally-formed CNT-based MCM stack is prone to short-circuiting. In addition, blanket CNT layers (and other carbon-based materials) may peel, are difficult to etch, may cause lithography/overlay issues and may be damaged during conventional fabrication processes. Improved methods and apparatus for forming memory cells that include CNT material are desirable.

Accordingly, exemplary embodiments of this invention use a damascene integration technique to form CNT layers 12 in memory cells 10. In an exemplary embodiment, described in more detail below, a blocking layer is formed above a substrate, a void is formed in the blocking layer, oxide structure 16 is formed on a sidewall of the void, and CNT layer 12 is selectively formed on oxide structure 16 by a CVD process. For example, a CVD process using a gas-phase precursor and a catalyst may be used. Other CNT growth processes may be used.

Figure 3A:
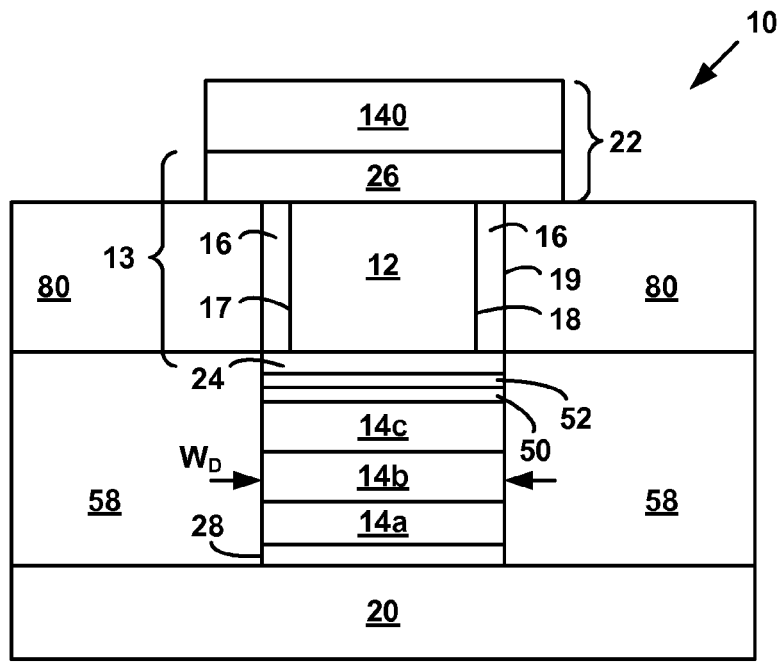
FIGS. 3A and 3B illustrate cross-sectional views of an exemplary embodiment of a memory cell in accordance with this invention.
Figure 3B:
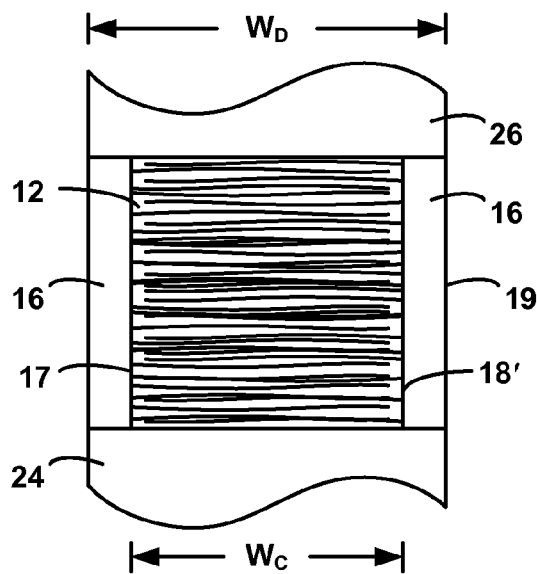

FIGS. 3A-3B illustrate cross-sectional views of an exemplary embodiment of memory cell 10 of FIG. 2A formed on a substrate, such as a wafer (not shown). With reference to FIG. 3A, memory cell 10 includes a CNT layer 12 coupled in series with diode 14 between first and second conductors 20 and 22, respectively. Memory cell 10 also includes oxide structure 16, and may include barrier layers 24, 26 and 28, a silicide layer 50, a silicide-forming metal layer 52, a dielectric layer 58, a blocking layer 80, as well as adhesion layers, antireflective coating layers and/or the like (not shown) which may be used with first and/or second conductors 20 and 22, respectively, to improve device performance and/or facilitate device fabrication.

First conductor 20 may include any suitable conductive material such as tungsten, any appropriate metal, heavily doped semiconductor material, a conductive silicide, a conductive silicide-germanide, a conductive germanide, or the like. Second conductor 22 includes a barrier layer 26, which may include titanium nitride or other similar barrier layer material, and conductive layer 140, which may include any suitable conductive material such as tungsten, any appropriate metal, heavily doped semiconductor material, a conductive silicide, a conductive silicide-germanide, a conductive germanide, or the like.

Diode 14 may be a vertical p-n or p-i-n diode, which may either point upward or downward. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

In some embodiments, diode 14 may be formed from a polycrystalline semiconductor material such as polysilicon, a polycrystalline silicon-germanium alloy, polygermanium or any other suitable material. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed.

In some embodiments, a thin germanium and/or silicon-germanium alloy layer (not shown) may be formed on n+ polysilicon region 14a to prevent and/or reduce dopant migration from n+ polysilicon region 14a into intrinsic region 14b. Use of such a layer is described, for example, in U.S. patent application Ser. No. 11/298,331, filed Dec. 9, 2005 and titled "Deposited Semiconductor Structure To Minimize N-Type Dopant Diffusion And Method Of Making" (the "'331 application"), which is hereby incorporated by reference herein in its entirety for all purposes. In some embodiments, a few hundred angstroms or less of silicon-germanium alloy with about ten atomic percent or more of germanium may be employed.

If diode 14 is fabricated from deposited silicon (e.g., amorphous or polycrystalline), a silicide layer 50 may be formed on diode 14 to place the deposited silicon in a low resistivity state, as fabricated. For example, a silicide-forming metal layer 52 such as titanium or cobalt may be deposited on p+ polysilicon region 14c. In some embodiments, an additional nitride layer (not shown) may be formed at a top surface of silicide-forming metal layer 52. In particular, for highly reactive metals, such as titanium, an additional cap layer such as a titanium nitride layer may be formed on silicide-forming metal layer 52. Thus, in such embodiments, a Ti/TiN stack is formed on top of p+ polysilicon region 14c.

A rapid thermal anneal ("RTA") step may then be performed to form silicide regions by reaction of silicide-forming metal layer 52 with p+ region 14c. The RTA step may be performed at a temperature between about 650° C. and about 750° C., more generally between about 600° C. and about 800° C., preferably at about 750° C., for a duration between about 10 seconds and about 60 seconds, more generally between about 10 seconds and about 90 seconds, preferably about 1 minute, and causes silicide-forming metal layer 52 and the deposited silicon of diode 14 to interact to form silicide layer 50, consuming all or a portion of the silicide-forming metal layer 52.

As described in U.S. Pat. No. 7,176,064, titled "Memory Cell Comprising A Semiconductor Junction Diode Crystallized Adjacent To A Silicide," which is incorporated by reference herein in its entirety for all purposes, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., silicide layer 50 enhances the crystalline structure of silicon diode 14 during annealing). Lower resistivity silicon thereby is provided. Similar results may be achieved for silicon-germanium alloy and/or germanium diodes.

In embodiments in which a nitride layer was formed at a top surface of silicide-forming metal layer 52, following the RTA step, the nitride layer may be stripped using a wet chemistry. For example, if silicide-forming metal layer 52 includes a titanium nitride top layer, a wet chemistry (e.g., $H_2O:H_2O_2$: $NH_4OH$ in a 10:2:1 ratio at a temperature of between about 40-60° C.) may be used to strip any residual titanium nitride.

A barrier layer 28, such as titanium, titanium nitride, tantalum, tantalum nitride, tungsten, tungsten nitride, molybdenum, or other similar material, may be formed between first conductor 20 and n+ region 14a (e.g., to prevent and/or reduce migration of metal atoms into the polysilicon regions). In some embodiments, barrier layer 28 may be titanium nitride with a thickness of between about 100 to 2000 angstroms, although other materials and/or thicknesses may be used.

Similarly, a barrier layer 24, such as titanium, titanium nitride, tantalum, tantalum nitride, tungsten, tungsten nitride, molybdenum, or other similar material, may be formed between diode 14 and CNT layer 12. In some embodiments, barrier layer 24 may be titanium nitride with a thickness of between about 50 to 200 angstroms, more generally between about 20 to 500 angstroms, although other materials and/or thicknesses may be used.

Second conductor 22 may include a barrier layer 26, such as titanium, titanium nitride, tantalum, tantalum nitride, tungsten, tungsten nitride, molybdenum, or other similar material. In some embodiments, barrier layer 26 may be titanium nitride with a thickness between about 100 to 2000 angstroms, although other materials and/or thicknesses may be used.

In exemplary embodiments of this invention, described in more detail with respect to FIG. 4, blocking layer 80 may be formed above diode 14, and then patterned and etched to create an opening 19 on top of diode 14. For example, an inverse mask used of diode 14 may be used. As a result, opening 19 is substantially aligned to diode 14 and has a width $W_D$ substantially equal to the width of diode 14, although some misalignment may be tolerated.

Blocking layer 80 may be a silicon nitride $Si_xN_y$ (e.g., $Si_3N_4$), a silicon carbide $Si_xC_y$ (e.g., SiC), or other similar material that is not conducive to CNT growth. In some embodiments, blocking layer 80 may be silicon nitride with a thickness of between about 50 to 500 angstroms, although other materials and/or thicknesses may be used. Oxide structure 16 is formed on sidewalls of opening 19. For example, a conformal oxide may be deposited over and in openings 19, and a spacer etch may be performed to remove substantially all but oxide material ("oxide spacer 16") on sidewalls of opening 19.

Oxide spacer 16 may be silicon oxide (SiO), silicon dioxide ($SiO_2$), or other similar conformal oxide. In some embodiments, oxide spacer 16 may be $SiO_2$ with a thickness of between about 50 to 250 angstroms, although other materials and/or thicknesses may be used. Oxide spacer 16 includes a sidewall 17 that defines an opening 18 extending between barrier layer 24 and barrier layer 26 and second conductor 22. Opening 18 has a width $W_C$, smaller than width $W_D$.

CNT layer 12 is grown on sidewalls 17 inside opening 18 of oxide spacers 16 using a selective growth technique. The thickness of blocking layer 80 determines the thickness of CNT layer 12. Thus, in exemplary embodiments of this invention, CNT layer 12 has a thickness of between about 50 to 500 angstroms. Other thicknesses may be used.

CNT growth on oxide is highly directional. As shown in FIG. 3B, CNT layer 12 includes CNTs grown on sidewalls 17 of oxide spacers 16 in a direction substantially parallel to the substrate. That is, CNT layer 12 includes CNTs having a long axis that is substantially parallel to the substrate.

Because blocking layer 80 is formed from a material (e.g., nitride) on which CNTs do not grow, CNT growth is substantially limited to opening 18. Although not wanting to be bound by any particular theory, it is believed that because CNT growth is confined to the volume defined by opening 18, CNT layer 12 has a much smaller void volume compared to previously known spin- and spray-coating CNT formation techniques.

CNT layer 12 may be formed by a CVD process, such as conventional CVD, thermal CVD, plasma enhanced chemical vapor deposition ("PECVD"), low-pressure chemical vapor deposition ("LPCVD"), hot filament chemical vapor deposition, low temperature CVD (e.g., LPCVD at or below about 600° C.), or other processes may be used. Exemplary CVD CNT growth processes use a processing gas or vapors from liquid hydrocarbons comprising one or more hydrocarbon compounds, and a catalyst-containing compound. Exemplary hydrocarbon compounds have the formula $C_xH_y$, with x ranging from about 1 to 4, and y ranging from about 2 to 10.

Exemplary catalyst-containing compounds include metallocenes, such as ferrocene ("$Fe(C_5H_5)_2$"), nickelocene ("$Ni(C_5H_5)_2$"), cobaltocene ("$Co(C_5H_5)_2$"), various oxides, such as aluminum oxide ("$Al_2O_3$"), titanium oxide ("$TiO_2$"), hafnium oxide ("$HfO_2$"), zirconium oxide ("$ZrO_2$"), or other similar compounds for seeding CNT growth. A catalyst-containing compound may be mixed with a liquid hydrocarbon source, and the vapor bubbled into the CVD reactor.

CVD can be done with or without carrier gas; if using carrier gas, the carrier gas may comprise any suitable inert or non-reactive gas such as one or more of He, Ar, Kr, Xe, $N_2$, etc.

Table 1 below describes an exemplary process window for growing CNT material within a PECVD chamber.

TABLE 1

EXEMPLARY PECVD PROCESS PARAMETERS

| PROCESS PARAMETER | EXEMPLARY RANGE | PREFERRED RANGE |
|---|---|---|
| Precursor Flow Rate (sccm) | 10-5000 | 50-2000 |
| Carrier Flow Rate (sccm) | 10-10000 | 1000-7000 |
| Carrier/Precursor Ratio | 1:1-100:1 | 1:1-50:1 |
| Chamber Pressure (Torr) | 0.8-10 | 2.5-7 |
| $1^{st}$ RF frequency (MHz) | 10-50 | 13.5 |
| $2^{nd}$ RF frequency (KHz) | 90-500 | 90 |
| RF Power Density (W/in$^2$) | 0.1-20 | 0.3-5 |
| $2^{nd}$ RF/$1^{st}$ RF Power Density Ratio | 0-1 | 0-0.5 |
| Process Temperature (° C.) | 100-900 | 300-550 |
| Electrode Spacing (Mils) | 200-1000 | 200-500 |

Other precursors, catalysts, carrier gasses, flow rates, ratios, pressures, frequencies, power densities, temperatures, and/or spacings may be used.

Although the exemplary embodiments illustrated in FIG. 3A shows carbon element 12 above diode 14, persons of ordinary skill in the art will understand that carbon element 12 alternatively may be positioned below diode 14. Further, although the exemplary memory cell 10 includes MCM 13 coupled to diode 14, persons of ordinary skill in the art will understand that memory cells 10 in accordance with this invention alternatively may include MCM devices coupled between first and second conductors 20 and 22, respectively, for use with remotely fabricated steering elements.

Exemplary Fabrication Processes for Memory Cells

Referring now to FIGS. 4A-4L, an exemplary method of forming an exemplary memory level in accordance with this invention is described. In particular, FIGS. 4A-4L illustrate an exemplary method of forming a memory level including memory cells 10 of FIG. 2A. As will be described below, the first memory level includes a plurality of memory cells that each include a steering element and a CNT-based reversible resistance-switching element coupled to the steering element. Additional memory levels may be fabricated above the first memory level (as described previously with reference to FIGS. 2C-2D).

With reference to FIG. 4A, substrate 100 is shown as having already undergone several processing steps. Substrate 100 may be any suitable substrate such as a silicon, germanium, silicon-germanium, undoped, doped, bulk, silicon-on-insulator ("SOI") or other substrate with or without additional circuitry. For example, substrate 100 may include one or more n-well or p-well regions (not shown).

Isolation layer 102 is formed above substrate 100. In some embodiments, isolation layer 102 may be a layer of silicon dioxide, silicon nitride, silicon oxynitride or any other similar insulating layer.

Following formation of isolation layer 102, an adhesion layer 104 is formed over isolation layer 102 (e.g., by PVD or other suitable method). For example, adhesion layer 104 may be about 20 to about 500 angstroms, and preferably about 100 angstroms, of titanium nitride or another suitable adhesion layer such as tantalum nitride, tungsten, tungsten nitride, molybdenum, combinations of one or more adhesion layers, or the like. Other adhesion layer materials and/or thicknesses may be employed. In some embodiments, adhesion layer 104 may be optional.

After formation of adhesion layer 104, a conductive layer 106 is deposited over adhesion layer 104. Conductive layer 106 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive layer 106 may comprise about 200 to about 2500 angstroms of tungsten. Other conductive layer materials and/or thicknesses may be used.

Following formation of conductive layer 106, adhesion layer 104 and conductive layer 106 are patterned and etched. For example, adhesion layer 104 and conductive layer 106 may be patterned and etched using conventional lithography techniques, with a soft or hard mask, and wet or dry etch processing. In at least one embodiment, adhesion layer 104 and conductive layer 106 are patterned and etched to form substantially parallel, substantially co-planar first conductors 20. Exemplary widths for first conductors 20 and/or spacings between first conductors 20 range from about 200 to about 2500 angstroms, although other conductor widths and/or spacings may be used.

After first conductors 20 have been formed, a dielectric layer (not shown) is formed over substrate 100 to fill the voids between first conductors 20. For example, approximately 3000-7000 angstroms of silicon dioxide may be deposited on substrate 100 and planarized using chemical mechanical polishing or an etchback process to form a planar surface 110. Planar surface 110 includes exposed top surfaces of first conductors 20 separated by dielectric material (not shown). Other dielectric materials such as silicon nitride, silicon oxynitride, low k dielectrics, etc., and/or other dielectric layer thicknesses may be used. Exemplary low k dielectrics include carbon doped oxides, silicon carbon layers, or the like.

In other embodiments of the invention, first conductors 20 may be formed using a damascene process in which a dielectric layer is formed, patterned and etched to create openings or voids for first conductors 20. The openings or voids then may be filled with adhesion layer 104 and conductive layer 106 (and/or a conductive seed, conductive fill and/or barrier layer if needed). Adhesion layer 104 and conductive layer 106 then may be planarized to form planar surface 110. In such an embodiment, adhesion layer 104 will line the bottom and sidewalls of each opening or void.

Following planarization, the diode structures of each memory cell are formed. In particular, a barrier layer 28 is formed over planarized top surface 110 of substrate 100. Barrier layer 28 may be between about 20 angstroms and about 500 angstroms, and preferably about 100 angstroms, of titanium nitride or another suitable barrier layer such as tantalum nitride, tungsten nitride, tungsten, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of barrier layer 28, deposition of the semiconductor material used to form the diode of each memory cell begins (e.g., diode 14 in FIGS. 2 and 3). Each diode may be a vertical p-n or p-i-n diode as previously described. In some embodiments, each diode is formed from a polycrystalline semiconductor material such as polysilicon, a polycrystalline silicon-germanium alloy, polygermanium or any other suitable material. For convenience, formation of a polysilicon, downward-pointing diode is described herein. It will be understood that other materials and/or diode configurations may be used.

Following formation of barrier layer 28, a heavily doped n+ silicon layer 14a is deposited on barrier layer 28. In some embodiments, n+ silicon layer 14a is in an amorphous state as deposited. In other embodiments, n+ silicon layer 14a is in a polycrystalline state as deposited. CVD or another suitable process may be employed to deposit n+ silicon layer 14a. In at least one embodiment, n+ silicon layer 14a may be formed, for example, from about 100 angstroms to about 1000 angstroms, preferably about 100 angstroms, of phosphorus or arsenic doped silicon having a doping concentration of about $1 \times 10^{21}$ cm$^{-3}$. Other layer thicknesses, doping types and/or doping concentrations may be used. N+ silicon layer 14a may be doped in situ, for example, by flowing a donor gas during deposition. Other doping methods may be used (e.g., implantation).

After deposition of n+ silicon layer 14a, a lightly doped, intrinsic and/or unintentionally doped silicon layer 14b is formed over n+ silicon layer 14a. In some embodiments, intrinsic silicon layer 14b is in an amorphous state as deposited. In other embodiments, intrinsic silicon layer 14b is in a polycrystalline state as deposited. CVD or another suitable deposition method may be employed to deposit intrinsic silicon layer 14b. In at least one embodiment, intrinsic silicon layer 14b may be about 500 angstroms to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on n+ silicon layer 14a prior to depositing intrinsic silicon layer 14b to prevent and/or reduce dopant migration from n+ silicon layer 14a into intrinsic silicon layer 14b (as described in the '331 application, previously incorporated).

Heavily doped, p-type silicon is either deposited and doped by ion implantation or is doped in situ during deposition to form a p+ silicon layer 14c. For example, a blanket p+ implant may be employed to implant boron a predetermined depth within intrinsic silicon layer 14b. Exemplary implantable molecular ions include BF$_2$, BF$_3$, B, Ga, Al and the like. In some embodiments, an implant dose of about 1-5×10$^{15}$ ions/cm$^2$ may be employed. Other implant species and/or doses may be used. Further, in some embodiments, a diffusion process may be employed. In at least one embodiment, the resultant p+ silicon layer 14c has a thickness of between about 100 angstroms and about 700 angstroms, although other p+ silicon layer sizes may be used.

Following formation of p+ silicon layer 14c, a silicide-forming metal layer 52 is deposited over p+ silicon layer 14c. Exemplary silicide-forming metals include sputter or otherwise deposited titanium or cobalt. In some embodiments, silicide-forming metal layer 52 has a thickness of between about 10 angstroms and about 200 angstroms, preferably between about 20 angstroms and about 50 angstroms and more preferably about 20 angstroms. Other silicide-forming metal layer materials and/or thicknesses may be used. A nitride layer (not shown) may be formed at the top of silicide-forming metal layer 52.

Following formation of silicide-forming metal layer 52, an RTA step may be performed at about 540° C. for about one minute to form silicide layer 50, consuming all or a portion of the silicide-forming metal layer 52. Following the RTA step, any residual nitride layer from silicide-forming metal layer 52 may be stripped using a wet chemistry, as described above, and as is known in the art.

A barrier layer 24 is deposited over silicide-forming metal layer 52. Barrier layer 24 may be between about 50-200 angstroms, more generally between about 20-500 angstroms, of titanium nitride or another suitable barrier layer such as tantalum nitride, tungsten nitride, tungsten, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed. Any suitable method may be used to form barrier layer 24. For example, CVD, PVD, atomic layer deposition ("ALD"), plasma enhanced atomic layer deposition ("PEALD"), or the like may be employed.

Figure 4B:
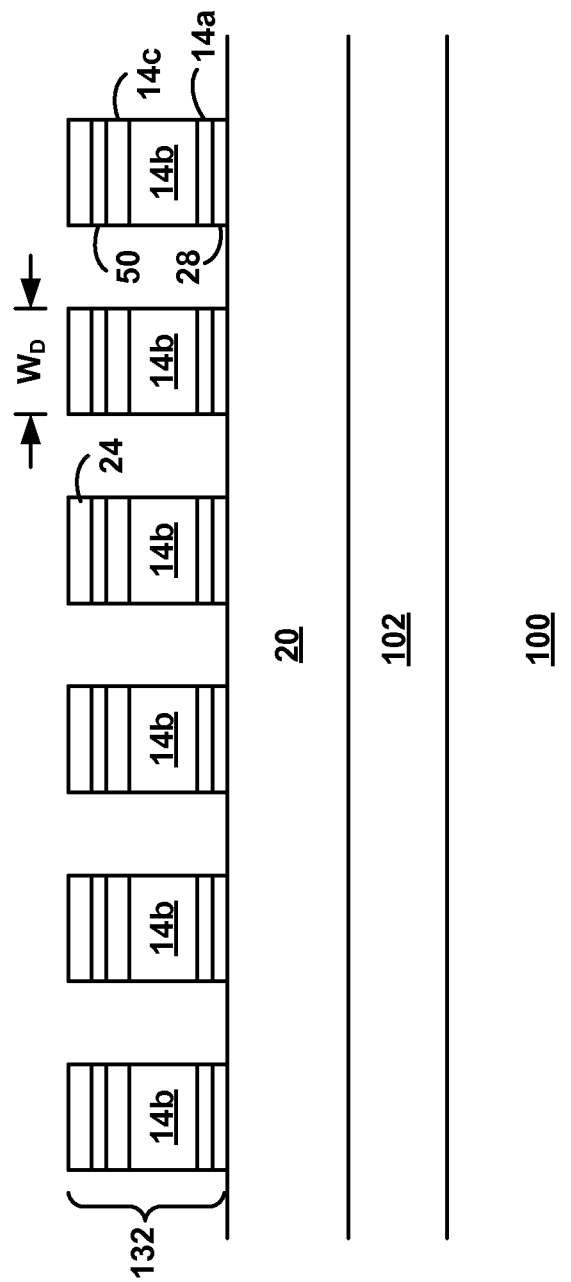
Figure 4C:
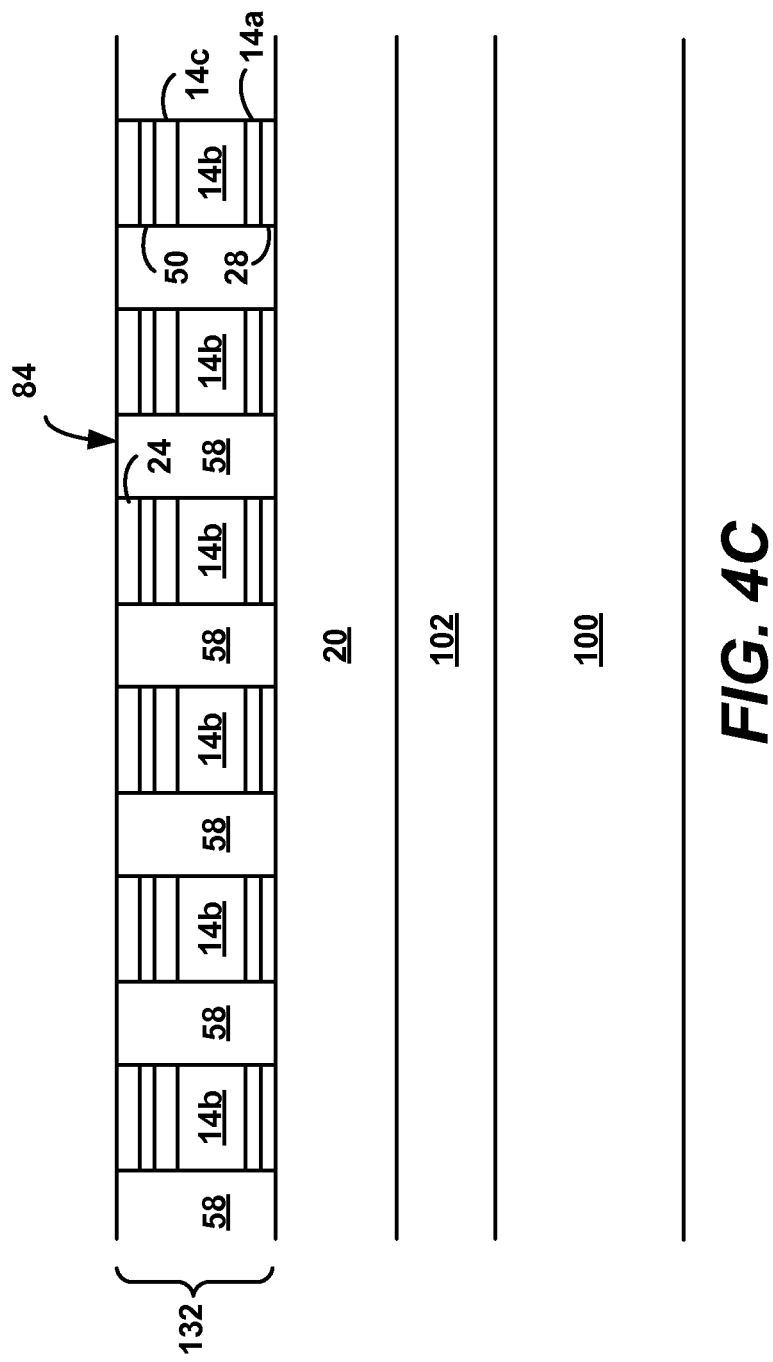

Next, barrier layer 24, silicide layer 50, diode layers 14a-14c and barrier layer 28 are patterned and etched to form pillars 132 having a width $W_D$, resulting in the structure shown in FIG. 4B Pillars 132 may have a width $W_D$ between about 300 angstroms and about 1500 angstroms, more generally between about 200 angstroms and 5000 angstroms.

For example, photoresist may be deposited, patterned using standard photolithography techniques, layers 24, 50, 14a-14c, and 28 may be etched, and then the photoresist may be removed. Alternatively, a hard mask of some other material, for example silicon dioxide, may be formed on top of the barrier layer 82, with bottom antireflective coating ("BARC") on top, then patterned and etched. Similarly, dielectric antireflective coating ("DARC") may be used as a hard mask.

Pillars 132 may be formed using any suitable masking and etching process. For example, layers 24, 50, 14a-14c, and 28 may be patterned with about 1 micron to about 1.5 micron, more preferably about 1.2 micron to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

Any suitable etch chemistries, and any suitable etch parameters, flow rates, chamber pressures, power levels, process temperatures, and/or etch rates may be used.

After etching, pillars 132 may be cleaned using a dilute hydrofluoric/sulfuric acid clean. Such cleaning, whether or not PR asking is performed before etching, may be performed in any suitable cleaning tool, such as a Raider tool, available from Semitool of Kalispell, Mont. Exemplary post-etch cleaning may include using ultra-dilute sulfuric acid (e.g., about 1.5-1.8 wt %) for about 60 seconds and ultra-dilute hydrofluoric ("HF") acid (e.g., about 0.4-0.6 wt) for 60 seconds. Megasonics may or may not be used.

Next, a dielectric layer 58 may be deposited over pillars 132 to fill the voids between pillars 132. For example, approximately 2000-7000 angstroms of silicon dioxide may be deposited and planarized using chemical mechanical polishing or an etchback process to remove excess dielectric material 58b and form a planar surface 84, resulting in the structure illustrated in FIG. 4C. Planar surface 84 includes exposed top surfaces of pillars 132 separated by dielectric material 58 (as shown). Other dielectric materials such as silicon nitride, silicon oxynitride, low k dielectrics, etc., and/or other dielectric layer thicknesses may be used. Exemplary low k dielectrics include carbon doped oxides, silicon carbon layers, or the like.

Figure 4D:
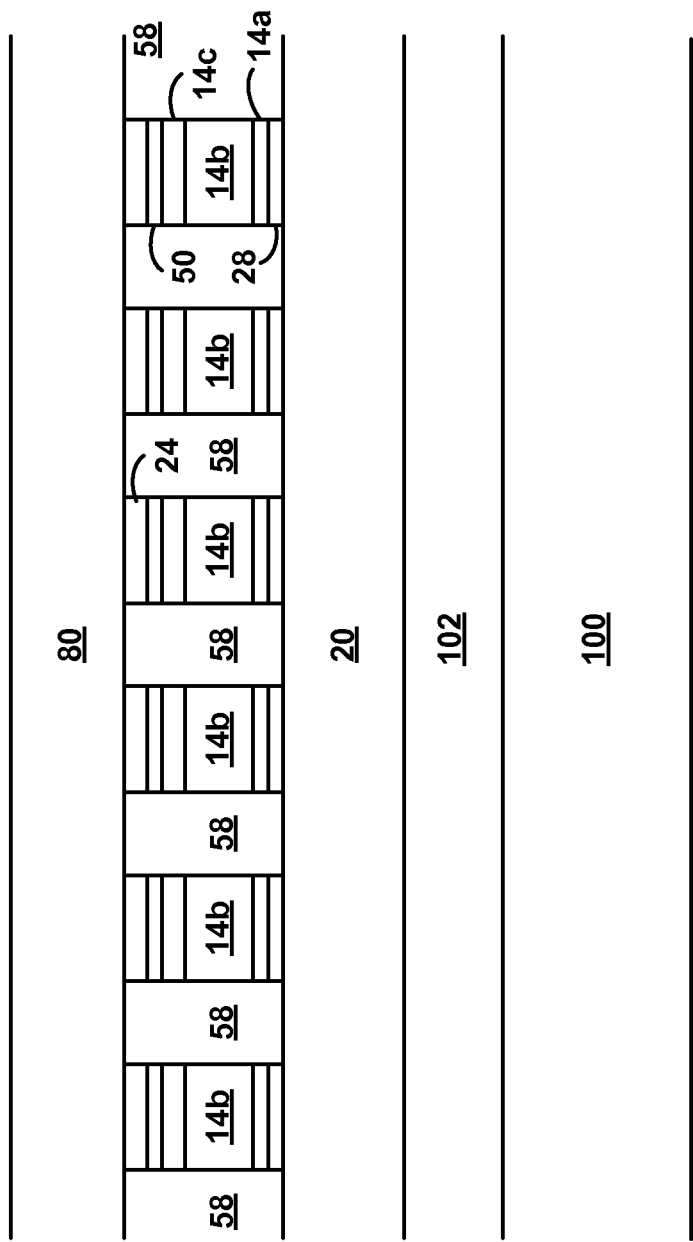

Formation of CNT layer 12 by damascene integration now begins. Referring to FIG. 4D, blocking layer 80 having a desired thickness is deposited over planar surface 110. The thickness of blocking layer 80 may dictate the largest possible thickness for CNT layer 12, as described further below. As mentioned above, blocking layer 80 may be between about 200-400 angstroms, more generally between about 50-500 angstroms, of silicon nitride or other similar material that is not conducive to CNT growth. Other dielectric materials such as silicon carbide, and/or other dielectric layer thicknesses may be used.

Next, blocking layer 80 is patterned and etched to form openings or voids 19 that expose each pillar 132 (e.g., barrier layer 28 if present), resulting in the structure shown in FIG. 4E. Some misalignment may be tolerated. Blocking layer 80 may be patterned and etched using known techniques such as wet or dry etching with a hard or soft mask. Openings 19 have a width $W_D$ substantially equal to the width of diodes 14. Openings 19 may have any suitable shape. For simplicity, openings 19 are depicted as having a cylindrical shape. Other shapes may be used, such as rectangular, triangular, oval, trapezoidal, rhomboidal, irregular, or other similar shape.

Figure 4F:
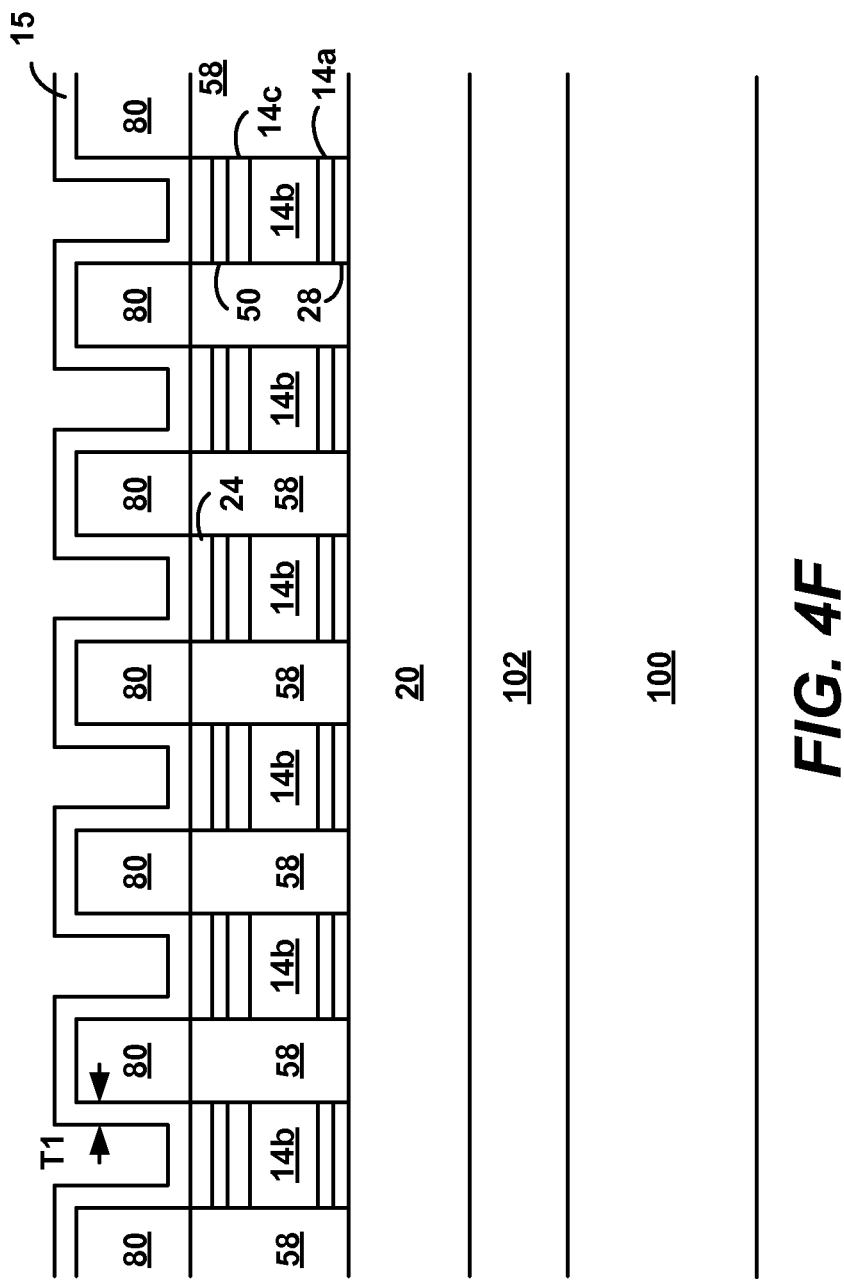

Next, a conformal oxide layer 15 is deposited over blocking layer 80 and openings 19, as shown in FIG. 4F. Oxide layer 15 may be formed using silicon dioxide, and/or $Si_xO_y$. Oxide layer 15 has a vertical sidewall thickness T1, which may be between about 50-250, more generally between about 25-500 angstroms. Other thicknesses may be used. Any suitable method may be used to form oxide layer 15. For example, CVD, LPCVD, PECVD, ALD, sub-atmospheric chemical vapor deposition ("SACVD"), pulsed deposition layer ("PLD") or the like may be employed.

Figure 4G:
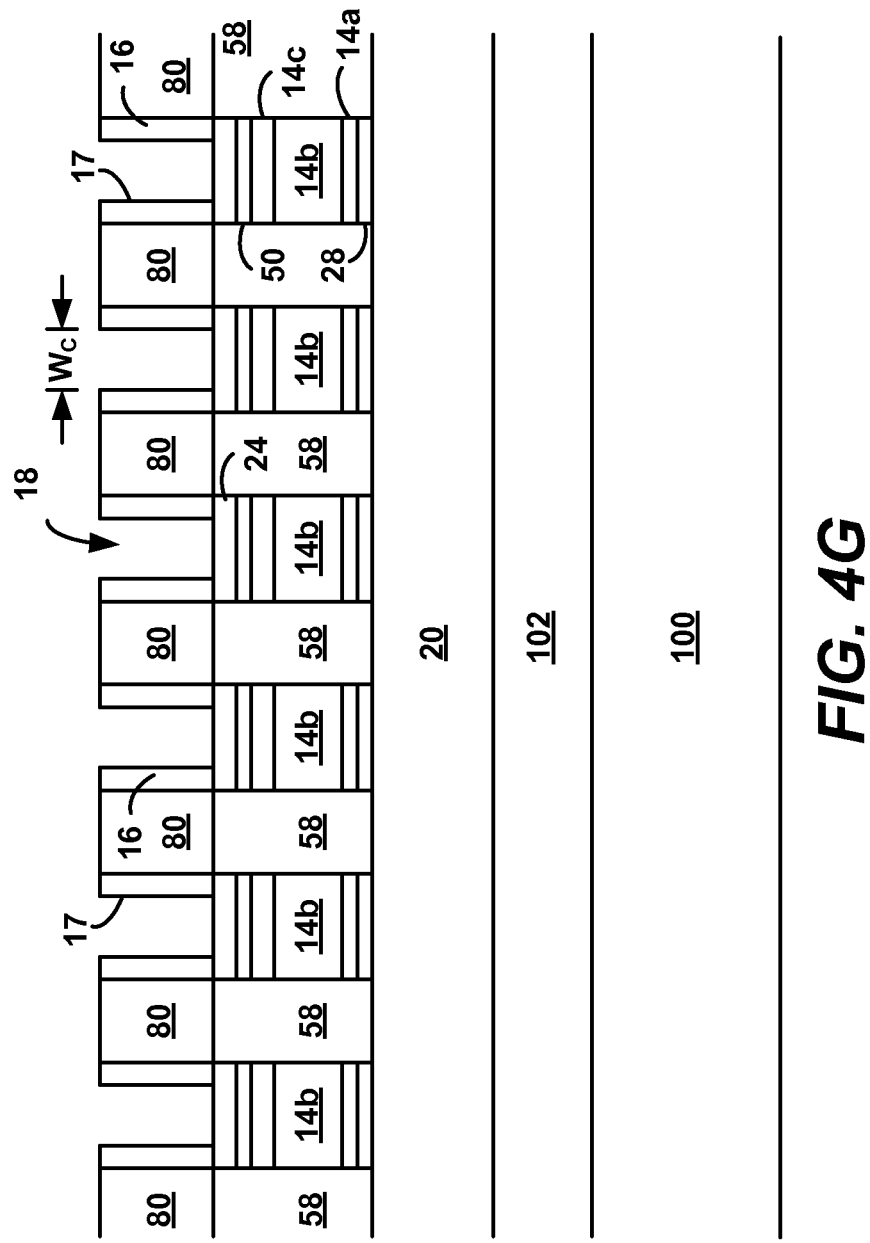

Next an anisotropic etch is used to remove lateral portions of oxide layer 15, leaving only oxide spacers 16 and openings 18, as illustrated in FIG. 4G. For example, a reactive ion etch, dry etch or other suitable process may be used to anisotropically etch oxide layer 15. The etch processes may be fluorine based (e.g., using sulfur hexafluoride ("$SF_6$"), carbon tetrafluoride ("$CF_4$"), trifluoromethane "$CHF_3$"), or chlorine based (e.g., using chlorine ("$Cl_2$"). Other etch processes may be used. Oxide spacers 16 have sidewalls 17. Openings 18 have a width $W_C$, which is smaller than width $W_D$ of diodes 14. Width $W_C$ may be between about 200-1000 angstroms, more generally between about 150-4000 angstroms. Other widths may be used.

Figure 4H:
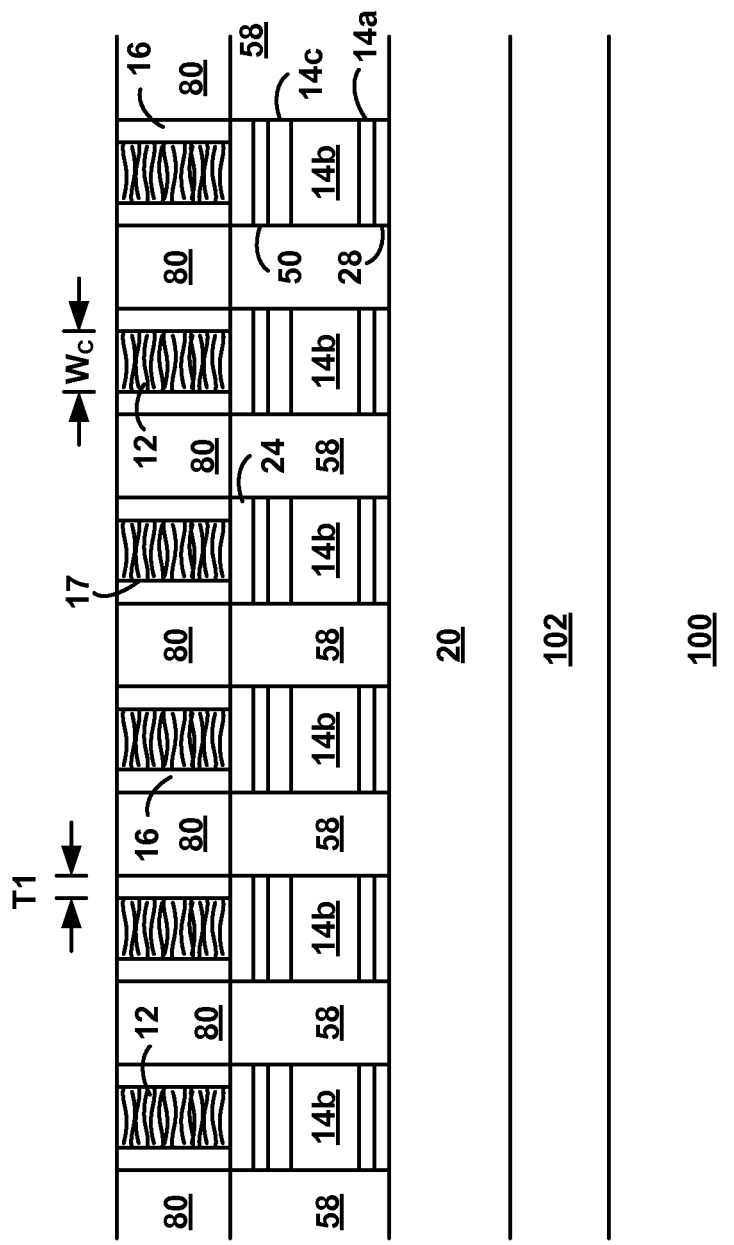
Figure 4J:
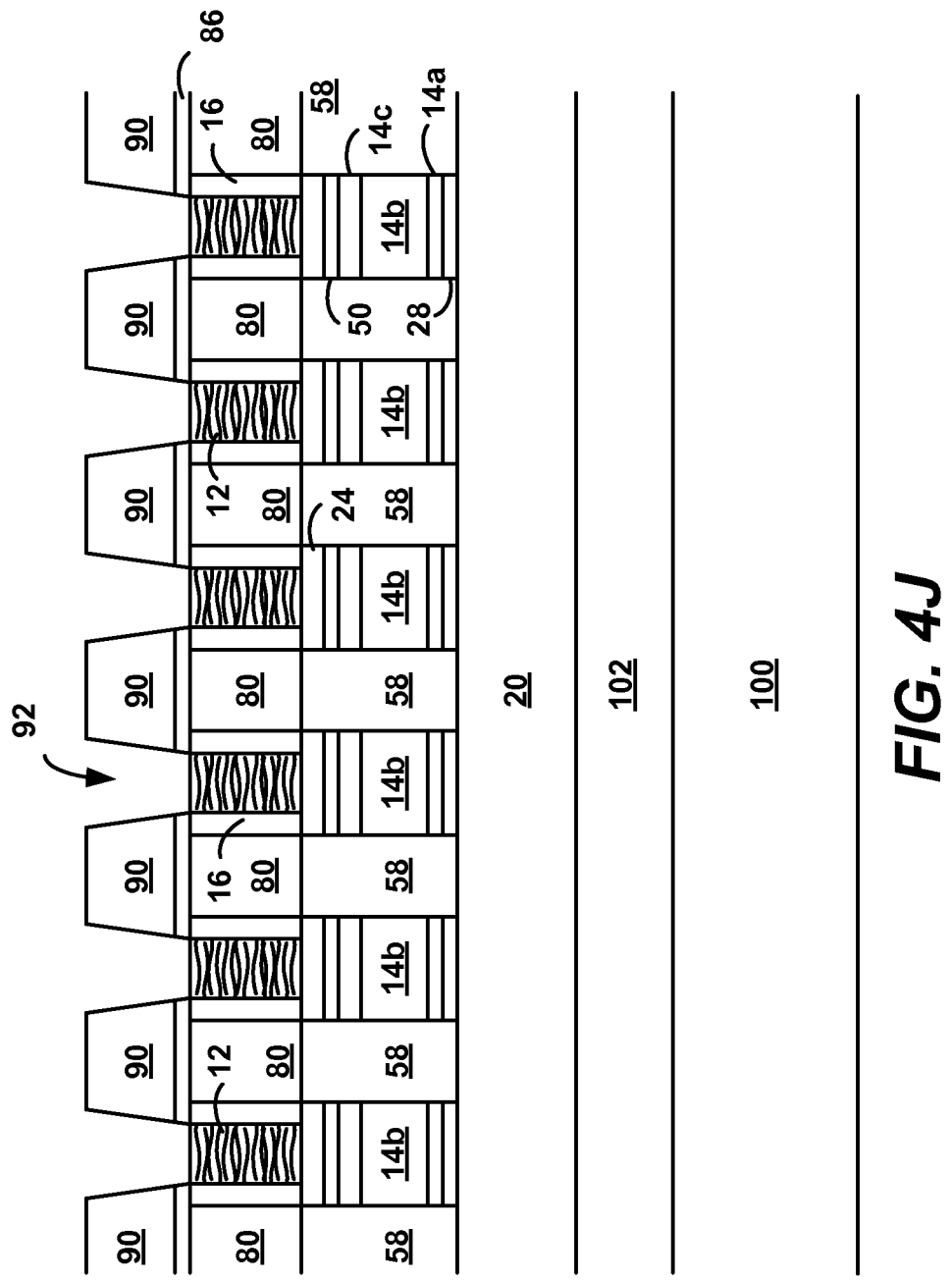

Following formation of oxide spacers 16, CNT layer 12 is formed in each opening 18 on sidewalls 17 of oxide spacers 16, resulting in the structure shown in FIG. 4H. For example, as described above in connection with FIG. 3, CNT layer 12 may be formed by a CVD process, such as conventional CVD, thermal CVD, PECVD, LPCVD, hot filament chemical vapor deposition, low temperature CVD (e.g., LPCVD at or below about 600° C. or other process.

As described above, CNT growth on oxide material is highly directional. In exemplary embodiments of this invention, CNT grow on sidewalls 17 of oxide spacers 16 in a direction substantially parallel to substrate 100. Thus, CNT layer 12 includes CNTs having a long axis that is substantially parallel to substrate 100.

The length of CNTs in CNT layer 12 is governed by the width $W_C$ of opening 18, which is approximately:

$$W_C = W_D - 2 \times T1$$

where T1 is the thickness of oxide spacers 16.

In some embodiments in accordance with this invention, following formation of CNT layer 12, an anneal step may be performed prior to depositing additional material. In particular, the anneal may be performed in a vacuum or the presence of one or more forming gases, at a temperature in the range from about 350° C. to about 900° C., for about 30 to about 180 minutes. The anneal preferably is performed in about an 80% (N$_2$):20% (H$_2$) mixture of forming gases, at about 625° C. for about one hour.

Suitable forming gases may include one or more of N$_2$, Ar, and H$_2$, whereas preferred forming gases may include a mixture having above about 75% N$_2$ or Ar and below about 25% H$_2$. Alternatively, a vacuum may be used. Suitable temperatures may range from about 350° C. to about 900° C., whereas preferred temperatures may range from about 585° C. to about 675° C. Suitable durations may range from about 0.5 hour to about 3 hours, whereas preferred durations may range from about 1 hour to about 1.5 hours. Suitable pressures may range from about 1 T to about 760 T, whereas preferred pressures may range from about 300 T to about 760 T.

A queue time of preferably about 2 hours between the anneal and the deposition of additional layers preferably accompanies the use of the anneal. A ramp up duration may range from about 0.2 hours to about 1.2 hours and preferably is between about 0.5 hours and 0.8 hours. Similarly, a ramp down duration also may range from about 0.2 hours to about 1.2 hours and preferably is between about 0.5 hours and 0.8 hours.

Although not wanting to be bound by any particular theory, it is believed that carbon-based materials may absorb water from the air over time. Likewise, it is believed that the moisture may increase the likelihood of de-lamination of carbon-based material. In some cases, it also might be acceptable to have a queue time of 2 hours from the time of deposition of a carbon-based material to deposition of additional layers, skipping the anneal altogether.

Incorporation of such a post-carbon-formation-anneal preferably takes into account other layers of the memory cell, because these other memory cell layers will also be subject to the anneal. For example, the anneal may be omitted or its parameters may be adjusted where the aforementioned preferred anneal parameters would damage the other memory cell layers. The anneal parameters may be adjusted within ranges that result in the removal of moisture without damaging the layers of the annealed memory cell. For instance, the temperature may be adjusted to stay within an overall thermal budget of a memory cell being formed. Likewise, any suitable forming gases, temperatures and/or durations may be used that are appropriate for a particular memory cell. In general, such an anneal may be used with any carbon-based layer or carbon-containing material, such as layers having CNT material, graphite, graphene, amorphous carbon, etc.

Referring to FIG. 4I, a capping layer 86 is formed over blocking layer 80 and CNT material 12 in openings 18', and CMP or etchback is used to form planar surface 88. In some embodiments, between about 50-100 angstroms, more generally between about 30-200 angstroms of capping layer material is deposited over blocking layer 80 and CNT material 12, resulting in a capping layer 86 thickness of about 30 angstroms to about 200 angstroms following planarization. Capping layer 86 may be a silicon nitride, such as Si$_3$N$_4$ formed by ALD. Other capping layer materials, thicknesses and/or deposition techniques may be employed.

Figure 4K:
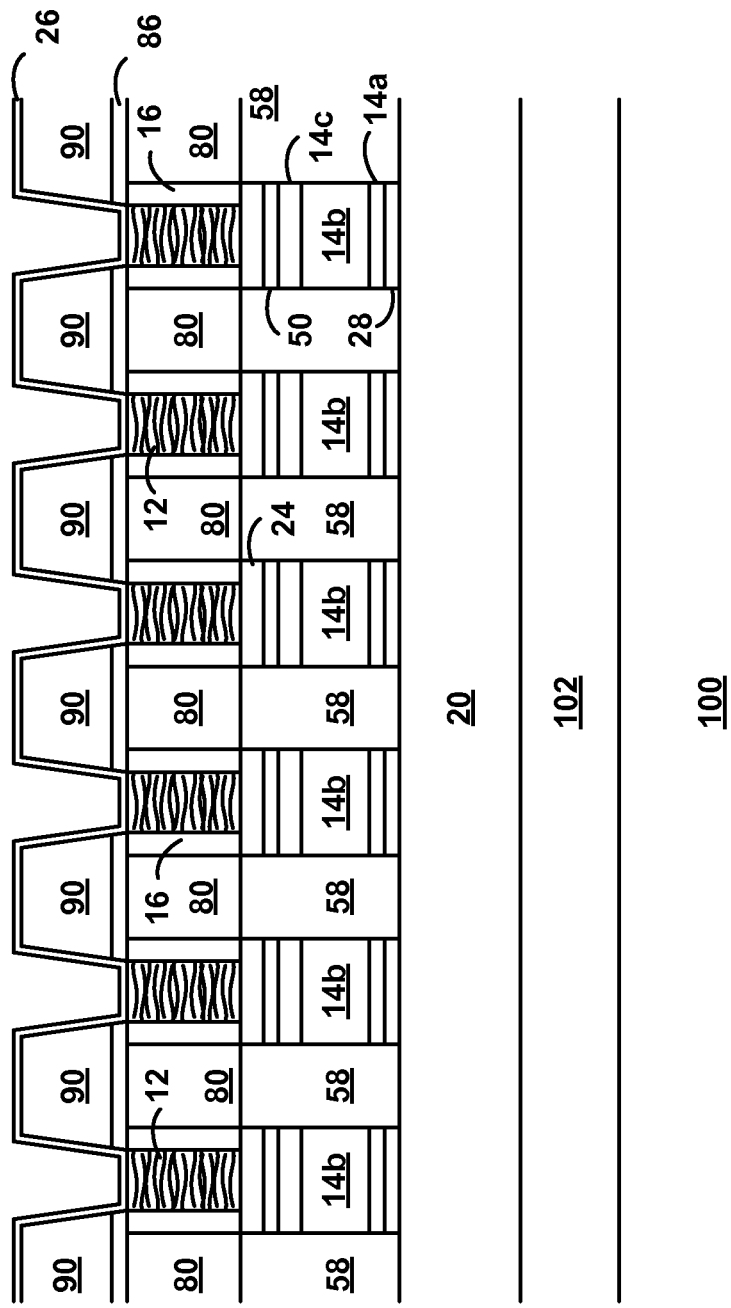

Next, second conductors 22 may be formed using a damascene process. For example, a dielectric layer 90 is formed over capping layer 86, and is patterned and etched to create openings or voids 92 for conductors 22, resulting in the structure shown in FIG. 4J. The openings or voids may be filled with adhesion layer 26, such as shown in FIG. 4K. Conductive layer 140 (and/or a conductive seed, conductive fill and/ or barrier layer if needed) is then deposited over adhesion layer 26.

Conductive layer 140 may be formed from any suitable conductive material such as tungsten, another suitable metal, heavily doped semiconductor material, a conductive silicide, a conductive silicide-germanide, a conductive germanide, or the like deposited by any suitable method (e.g., CVD, PVD, etc.). Other conductive layer materials may be used. Barrier layers and/or adhesion layers 26 may include titanium nitride or another suitable layer such as tantalum nitride, tungsten nitride, combinations of one or more layers, or any other suitable material(s).

Figure 4L:
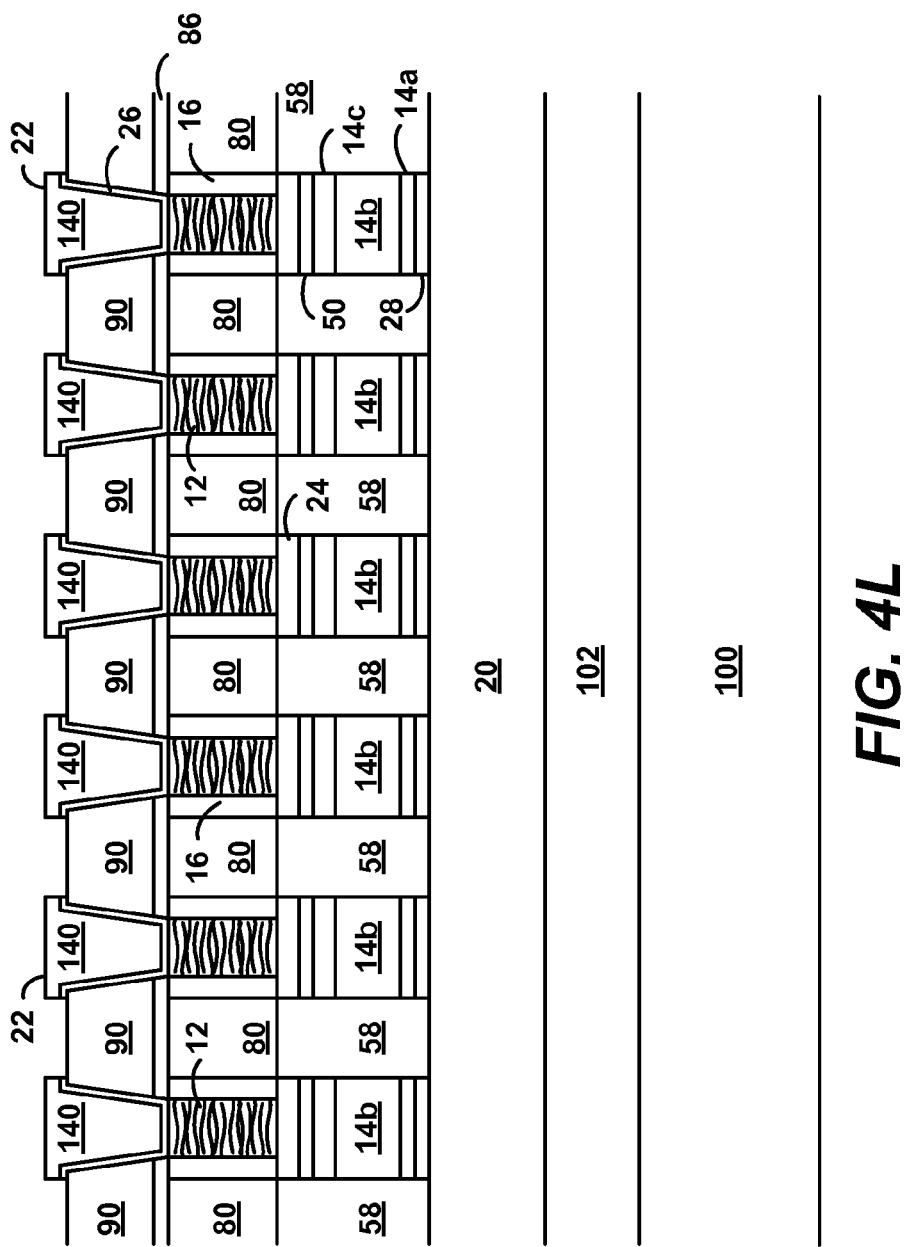

The deposited conductive layer 140 and barrier and/or adhesion layer 36 may be patterned and etched to form second conductors 22, as shown in FIG. 4L. In at least one embodiment, second conductors 22 are substantially parallel, substantially coplanar conductors that extend in a different direction than first conductors 20.

Following formation of second conductors 22, the resultant structure may be annealed to crystallize the deposited semiconductor material of diodes 14 (and/or to form silicide regions by reaction of the silicide-forming metal layer 52 with p+ region 14c). The lattice spacing of titanium silicide and cobalt silicide are close to that of silicon, and it appears that silicide layers 50 may serve as "crystallization templates" or "seeds" for adjacent deposited silicon as the deposited silicon crystallizes (e.g., silicide layer 50 enhances the crystalline structure of silicon diode 14 during annealing at temperatures of about 600-800° C.). Lower resistivity diode material thereby is provided. Similar results may be achieved for silicon-germanium alloy and/or germanium diodes.

Thus in at least one embodiment, a crystallization anneal may be performed for about 10 seconds to about 2 minutes in nitrogen at a temperature of about 600 to 800° C., and more preferably between about 650 and 750° C. Other annealing times, temperatures and/or environments may be used.

The foregoing description discloses only exemplary embodiments of the invention. Modifications of the above disclosed apparatus and methods which fall within the scope of the invention will be readily apparent to those of ordinary skill in the art. For instance, in any of the above embodiments, the CNT material may be located below diodes 14. Further, persons of ordinary skill in the art will understand that memory cells 10 in accordance with this invention alternatively may include MCM stacks coupled between first and second conductors 20 and 22, respectively, for use with remotely fabricated steering elements.

Accordingly, although the present invention has been disclosed in connection with exemplary embodiments thereof, it should be understood that other embodiments may fall within the spirit and scope of the invention, as defined by the following claims.

The invention claimed is:

1. A memory cell comprising:
   a first conducting layer formed above a substrate;
   a second conducting layer formed above the first conducting layer;
   a structure formed between the first and second conducting layers, wherein the structure includes a sidewall that defines an opening extending between the first and second conducting layers, and wherein the structure is comprised of a material that facilitates selective, directional growth of carbon nano-tubes; and
   a reversible resistance-switching material that includes carbon nano-tubes formed on the sidewall of the structure, wherein the carbon nanotubes have a long axis substantially in a plane that is parallel to the substrate.

2. The memory cell of claim 1, wherein the structure comprises a conformal oxide.

3. The memory cell of claim 1, wherein the structure comprises one or more of silicon oxide and silicon dioxide.

4. The memory cell of claim 1, wherein the sidewall has a thickness between about 50 to 250 angstroms.

5. The memory cell of claim 1, wherein the structure has a thickness between about 50 to 500 angstroms.

6. The memory cell of claim 1, wherein reversible resistance-switching material is formed from a chemical vapor deposition process.

7. The memory cell of claim 1, wherein the reversible resistance-switching material is formed from any of a conventional chemical vapor deposition process, thermal chemical vapor deposition process, plasma enhanced chemical vapor deposition process, low-pressure chemical vapor deposition process, hot filament chemical vapor deposition process, and low temperature chemical vapor deposition process.

8. The memory cell of claim 1, wherein the first conducting layer, reversible resistance-switching material and second conducting layer form a metal-carbon-metal ("MCM") stack.

9. The memory cell of claim 8, further comprising a steering element coupled to the MCM stack.

10. The memory cell of claim 9, wherein the steering element comprises a polycrystalline diode.

11. The memory cell of claim 9, wherein the steering element comprises a p-n or p-i-n diode.

12. A memory cell comprising:
a first conducting layer formed above a substrate;
a second conducting layer formed above the first conducting layer;
an oxide structure formed between the first and second conducting layers, wherein the oxide structure includes a sidewall that defines an opening extending between the first and second conducting layers; and
a reversible resistance-switching material that includes carbon nano-tubes formed on the sidewall of the structure, wherein the carbon nanotubes have a long axis substantially in a plane that is parallel to the substrate.

13. The memory cell of claim 12, wherein the oxide structure comprises a conformal oxide.

14. The memory cell of claim 12, wherein the oxide structure comprises one or more of silicon oxide and silicon dioxide.

15. The memory cell of claim 12, wherein the sidewall has a thickness between about 50 to 250 angstroms.

16. The memory cell of claim 12, wherein the oxide structure has a thickness between about 50 to 500 angstroms.

17. The memory cell of claim 12, wherein the reversible resistance-switching material is formed from a chemical vapor deposition process.

18. The memory cell of claim 12, wherein the reversible resistance-switching material is formed from any of a conventional chemical vapor deposition process, thermal chemical vapor deposition process, plasma enhanced chemical vapor deposition process, low-pressure chemical vapor deposition process, hot filament chemical vapor deposition process, and low temperature chemical vapor deposition process.

19. The memory cell of claim 12, wherein the first conducting layer, reversible resistance-switching material and second conducting layer form a metal-carbon-metal ("MCM") stack.

20. The memory cell of claim 19, further comprising a steering element coupled to the MCM stack.

21. The memory cell of claim 20, wherein the steering element comprises a polycrystalline diode.

22. The memory cell of claim 20, wherein the steering element comprises a p-n or p-i-n diode.

* * * * *